United States Patent
Chen et al.

(10) Patent No.: US 10,113,229 B2
(45) Date of Patent: Oct. 30, 2018

(54) TECHNIQUES FOR CONTROLLING ION/NEUTRAL RATIO OF A PLASMA SOURCE

(71) Applicant: Varian Semiconductor Equipment Associates, Inc., Gloucester, MA (US)

(72) Inventors: Tsung-Liang Chen, Danvers, MA (US); John Hautala, Beverly, MA (US); Shurong Liang, Poughkeepsie, NY (US); Joseph Olson, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 128 days.

(21) Appl. No.: 14/976,675

(22) Filed: Dec. 21, 2015

(65) Prior Publication Data
US 2017/0178900 A1 Jun. 22, 2017

(51) Int. Cl.
| | |
|---|---|
| C23C 14/54 | (2006.01) |
| H01L 21/02 | (2006.01) |
| C23C 14/22 | (2006.01) |
| H01J 37/32 | (2006.01) |
| C23C 14/48 | (2006.01) |
| C23C 16/04 | (2006.01) |

(Continued)

(52) U.S. Cl.
CPC ............ *C23C 14/54* (2013.01); *C23C 14/221* (2013.01); *C23C 14/48* (2013.01); *C23C 16/045* (2013.01); *C23C 16/345* (2013.01); *C23C 16/45544* (2013.01); *C23C 16/52* (2013.01); *H01J 37/32422* (2013.01); *H01L 21/0217* (2013.01); *H01L 21/02274* (2013.01)

(58) Field of Classification Search
None
See application file for complete search history.

(56) References Cited

U.S. PATENT DOCUMENTS

| | | | | |
|---|---|---|---|---|
| 5,888,593 A * | 3/1999 | Petrmichl | ............ | C23C 16/0245 204/192.35 |
| 8,461,554 B1 * | 6/2013 | Kurunczi | .......... | H01J 37/32146 118/723 E |

(Continued)

FOREIGN PATENT DOCUMENTS

KR    20110093252 A    8/2011

OTHER PUBLICATIONS

ISR and Written Opinion dated Mar. 13, 2017 in corresponding international patent application No. PCT/US2016/063840.

*Primary Examiner* — Shamim Ahmed
*Assistant Examiner* — Bradford M Gates

(57) ABSTRACT

Approaches herein increase a ratio of reactive ions to a neutral species in a plasma processing apparatus. Exemplary approaches include providing a processing apparatus having a plasma source chamber including a first gas inlet, and a deposition chamber coupled to the plasma source chamber, wherein the deposition chamber includes a second gas inlet for delivering a point of use (POU) gas to an area proximate a substrate disposed within the deposition chamber. Exemplary approaches further include generating an ion beam for delivery to the substrate, and modifying a pressure within the deposition chamber in the area proximate the substrate to increase an amount of reactive ions present for impacting the substrate when the ion beam is delivered to the substrate.

20 Claims, 4 Drawing Sheets

(51) Int. Cl.
  *C23C 16/34*  (2006.01)
  *C23C 16/455* (2006.01)
  *C23C 16/52*  (2006.01)

(56) References Cited

U.S. PATENT DOCUMENTS

| | | | |
|---|---|---|---|
| 2008/0173401 A1 | 7/2008 | Jeon | |
| 2014/0038393 A1* | 2/2014 | Godet | H01J 37/32366 |
| | | | 438/478 |
| 2014/0234554 A1* | 8/2014 | Radovanov | H05H 3/00 |
| | | | 427/569 |

* cited by examiner

TECHNIQUES FOR CONTROLLING ION/NEUTRAL RATIO OF A PLASMA SOURCE

FIELD OF THE DISCLOSURE

The present embodiments relate to substrate deposition, and more particularly, to techniques for controlling ion/neutral ratio exiting a plasma source.

BACKGROUND OF THE DISCLOSURE

As semiconductor devices scale to smaller dimensions, a need has arisen to more accurately define and control the dimensions and shapes of photoresist (resist) features used to pattern substrates. Conformal, uniform dielectric films have many applications in semiconductor manufacturing. In the fabrication of sub-micron integrated circuits (ICs) several layers of dielectric film are deposited. For example, four such layers are shallow trench isolation (STI), pre-metal dielectric (PMD), inter-metal dielectric (IMD) and interlayer dielectric (ILD). All four of these layers require silicon dioxide films filling features of various sizes and have uniform film thicknesses across the wafer.

Applications such as self-aligned doping may include a top part of an IC trench capped with a hardmask so just the bottom part of the fin is exposed to the dopant source. Another application may include a gap fill requiring bottom up film deposition to achieve void/seam free trench isolation.

Chemical vapor deposition (CVD) is one method for depositing silicon dioxide films. However, as design rules continue to shrink, the aspect ratios (depth to width) of features increase, and traditional CVD techniques can no longer provide void-free gap-fill in these high aspect ratio features. An alternative to CVD is atomic layer deposition (ALD). ALD methods involve self-limiting adsorption of reactant gases and can provide thin, conformal dielectric films within high aspect ratio features. An ALD-based dielectric deposition technique may involve adsorbing a metal containing precursor onto the substrate surface, then, in a second procedure, introducing a silicon oxide precursor gas.

However, current thin film deposition methods lack adequate control over where the deposition happens. For processes such as LPCVD (low pressure CVD) and ALD, the film deposition is conformal. LPCVD relies on thermal reaction on the surface, and ALD is a layer process through sequential chemical exposure. For plasma enhanced chemical vapor deposition (PECVD) processes, the deposition may result in a "bread-loaf" shape due to the ion-induced deposition.

In some approaches, ALD relies on alternate pulsing of the precursor gases onto the substrate surface and subsequent surface reaction of the precursors. ALD can also be achieved in a plasma environment (PEALD) as the surface is exposed to the active species generated by plasma during the reactant process. However, typical ALD chemistry is self-limiting with no areal selectivity, the areal selectivity giving conformal behavior of the deposition.

Furthermore, plasma ions affect film property modification, yet have minimal control over the surface reaction. For example, with PECVD, the film formation is mainly due to radical reaction on the surface, wherein controlling the reaction location to achieve directional ion beam deposition is difficult. In some prior art approaches, there exists a possibility to utilize directional ion bombardment toward higher deposition rate at a specific location. However, the impact is minimal due to the small ion/neutral ratio generated from the flow discharge.

SUMMARY OF THE DISCLOSURE

In view of the foregoing, techniques are needed to actively control an amount of a neutral species (e.g., neutral atoms and/or molecules) exiting the plasma source in order to maximize the impact from ions to the deposition or other type of chemistry. Specifically, exemplary approaches include providing a processing apparatus having a plasma source chamber including a first gas inlet, and a deposition chamber coupled to the plasma source chamber, wherein the deposition chamber includes a second gas inlet for delivering a point of use (POU) gas to an area proximate a substrate disposed within the deposition chamber. Exemplary approaches further include generating an ion beam for delivery to the substrate, and modifying a pressure within the deposition chamber in the area proximate the substrate to increase an amount of reactive ions present for impacting the substrate when the ion beam is delivered to the substrate. As such, for directional ion beam deposition, the higher pressure proximate the substrate advantageously reduces a total amount of neutrals delivered to the substrate so as to maximize the ion energy impact of the ion implant.

An exemplary method includes providing a processing apparatus including a plasma source chamber including a first gas inlet, and a deposition chamber coupled to the plasma source chamber, wherein the deposition chamber includes a second gas inlet for delivering a point of use (POU) gas to an area proximate a substrate disposed within the deposition chamber. The method further includes generating an ion beam for delivery to the substrate, and modifying a pressure within the deposition chamber in the area proximate the substrate to increase an amount of reactive ions impacting the substrate when the ion beam is delivered to the substrate.

An exemplary method for increasing a ratio of reactive ions to a neutral species includes increasing a pressure within a deposition chamber in an area proximate a substrate to increase an amount of reactive ions present for impacting the substrate when an ion beam is delivered to the substrate, wherein the pressure is increased by adjusting at least one of the following: a gas flow rate of a first inlet of a plasma source chamber, a gas flow rate of at least one gas inlet of the deposition chamber, and a distance between the substrate and the plasma source chamber. The method further includes generating an ion beam for delivery to the substrate.

Another exemplary method for increasing a ratio of reactive ions to a neutral species includes increasing a pressure within a deposition chamber in an area proximate a substrate to increase an amount of reactive ions present for impacting the substrate when an ion beam is delivered to the substrate, wherein the pressure is increased by optimizing the following: a gas flow rate of a first inlet of a plasma source chamber, a gas flow rate of at least one gas inlet of the deposition chamber, a distance between the substrate and the plasma source chamber, a pump speed of a deposition chamber pump, and a pump speed of a plasma source chamber pump. The method further includes generating an ion beam for delivery to the substrate, wherein the increase in pressure in the area proximate the substrate increases a ratio of reactive ions to neutral species impacting the substrate when the ion beam is delivered to the substrate, and wherein the ion beam is delivered to the substrate at a non-perpendicular angle relative to the substrate.

Figure 1:
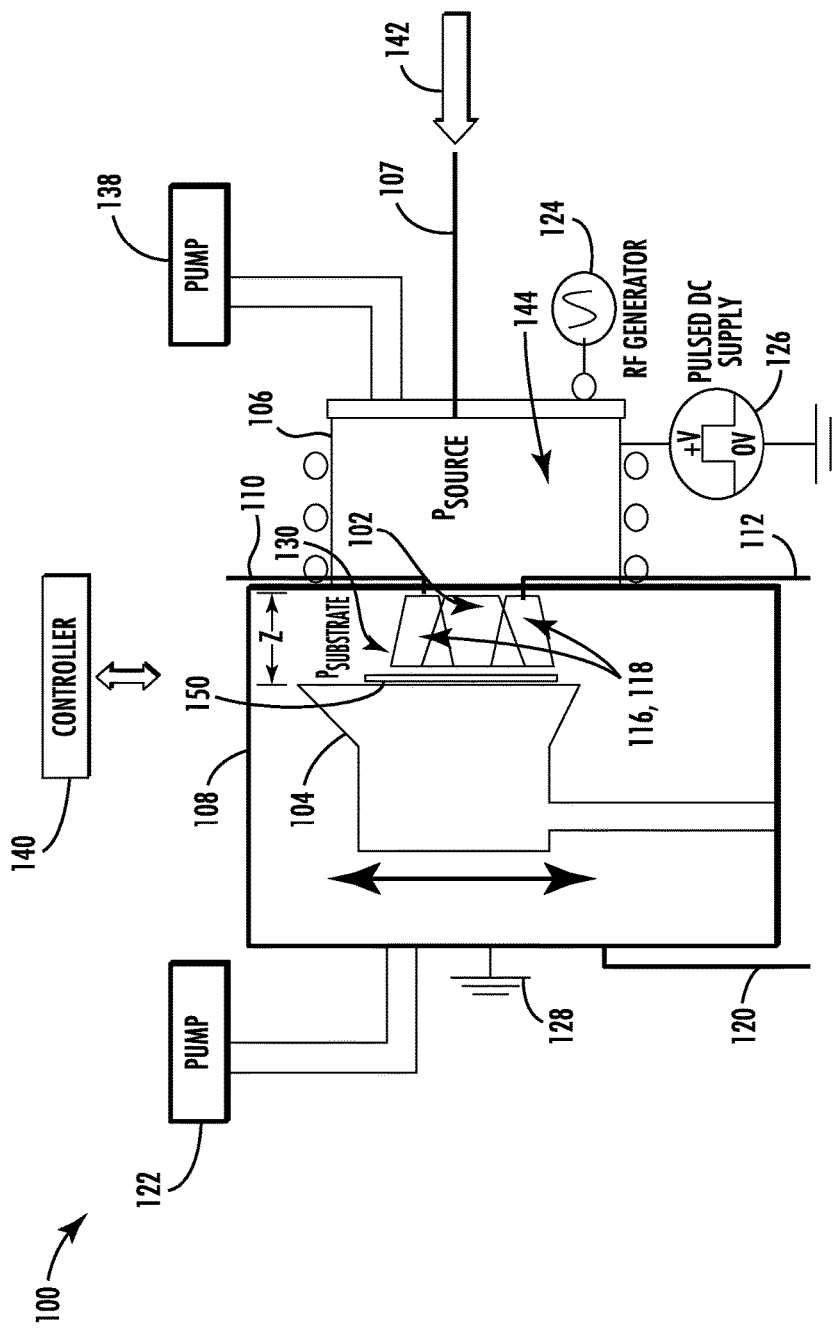
FIG. 1 is cross-sectional view of a processing apparatus according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods in accordance with the present disclosure will now be described more fully hereinafter with reference to the accompanying drawings, where embodiments of the methods are shown. The methods may be embodied in many different forms and are not to be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

As used herein, the term "atomic layer deposition" or "ALD" may refer to a vapor deposition process whereby deposition cycles, preferably a plurality of consecutive deposition cycles, are conducted in a process chamber (i.e., a deposition chamber). During the cycles, the precursor may be chemisorbed to a deposition surface (e.g., a substrate assembly surface or a previously deposited underlying surface such as material from a previous ALD cycle), forming a monolayer or sub-monolayer not readily reacting with additional precursor (i.e., a self-limiting reaction). Thereafter, a reactant (e.g., another precursor or reaction gas) may be introduced into the process chamber for use in converting the chemisorbed precursor to the desired material on the deposition surface. Typically, this reactant is capable of reaction with the already chemisorbed precursor. Additionally, purging processes may also be utilized, as necessary, during the cycles to remove excess precursor from the process chamber and/or remove excess reactant and/or reaction by-products from the process chamber after conversion of the chemisorbed precursor.

As compared to the one process CVD process, the longer duration multi-cycle ALD process provides improved control of layer thickness and composition by self-limiting layer growth, and minimizes detrimental gas phase reactions by separation of the reaction components. The self-limiting nature of ALD provides a method of depositing a film on a wide variety of reactive surfaces, including surfaces with irregular topographies, with better coverage than is available with CVD or with other "line of sight" deposition methods such as evaporation or physical vapor deposition (PVD or sputtering). As will be described in further detail below, the ALD process is further enhanced using directional ion beam activation.

Turning now to FIG. 1 there is shown a cross-sectional view of a processing apparatus 100 and approaches for increasing a ratio of reactive ions to neutral species in an ion beam 102 directed to a substrate 104 for forming a device (e.g., a semiconductor device) according to various embodiments of the disclosure. The processing apparatus 100 may be a beamline ion implanter, a plasma doping tool (PLAD), a plasma tool having a plasma sheath modifier, or other tool capable of generating and delivering ions to the substrate 104. The embodiments of the disclosure are not limited in this context.

Figure 2:
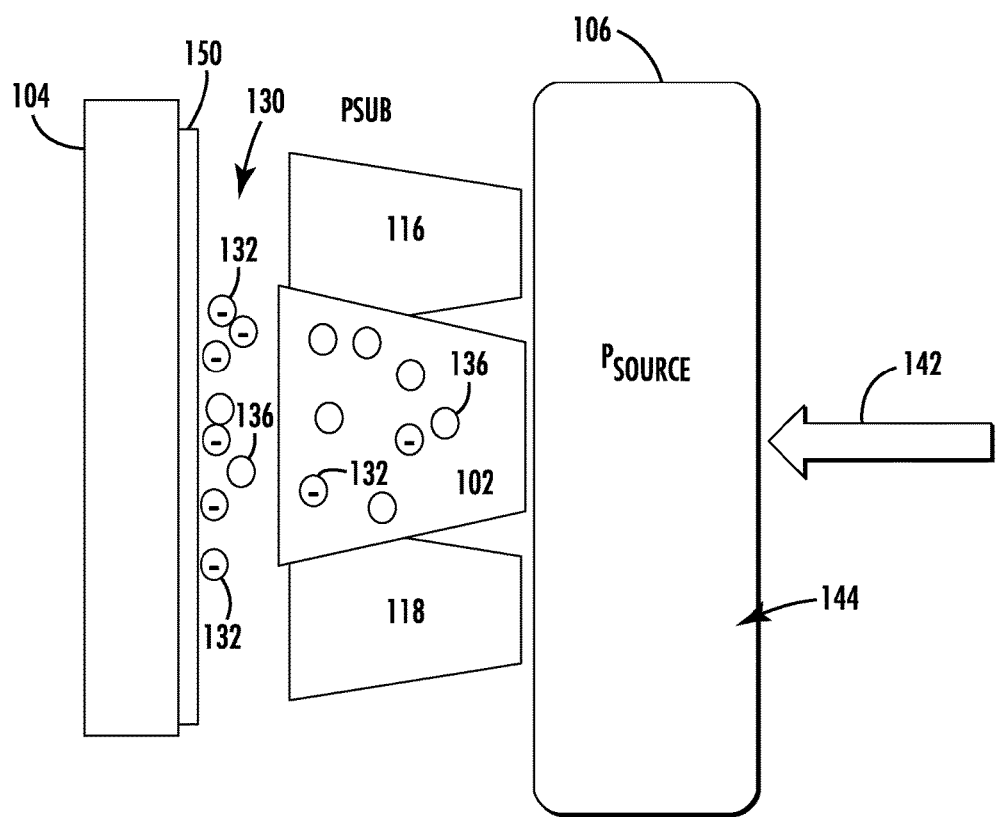
FIG. 2 is cross-sectional view of a plurality of reactive ions and neutral species present in the processing apparatus of FIG. 1 according to embodiments of the present disclosure.

As shown in FIGS. 1-2, the processing apparatus 100 includes a plasma source chamber 106 having a first gas inlet 107, and a deposition chamber 108 coupled to the plasma source chamber 106 for generation of the ion beam 102 (e.g., a ribbon beam). The deposition chamber 108 includes a second gas inlet 110 and a third gas inlet 112 for respectively delivering first and second point of use (POU) gases 116 and 118 to an area 130 adjacent the substrate 104 disposed within the deposition chamber 108, as will be described in greater detail below. The deposition chamber 108 further includes a fourth gas inlet 120 and a deposition chamber pump 122 to regulate gas flow and pressure within the deposition chamber 108. As further shown, the processing apparatus 100 includes an RF generator 124 and a pulsed DC supply 126 for generating an extraction voltage used to extract the ion beam 102 from the plasma source chamber 106. The deposition chamber 108 may also include a bias power supply 128 electrically coupled thereto.

During operation, the processing apparatus 100 is configured to modify a pressure Psub within the deposition chamber 108 in the area 130 proximate the substrate 104 to increase an amount of reactive ions 132, and/or decrease a number of neutral species 136 (e.g., neutral atoms/molecules), impacting the substrate 104 when the ion beam 102 is delivered to the substrate 104. More specifically, by increasing a pressure gradient between the plasma source chamber 106 and the deposition chamber 108, a total amount of the neutral atoms/molecules 136 delivered to the substrate 104 can be reduced to maximize the ion energy impact provided by an angled ion beam implant.

In exemplary embodiments, this increased pressure delta between Psub and Psource may be provided by optimizing/adjusting at least one of the following parameters of the processing apparatus 100: a gas flow rate of the first gas inlet 107, a gas flow rate of the second gas inlet 110, a gas flow rate of the third gas inlet 112, a gas flow rate of the fourth gas inlet 120, and/or a distance 'z' between the substrate 104 and the plasma source chamber 106. In one embodiment, one or more control valves (not shown) may be used to modify the various gas flow rates of the gas inlets of the processing apparatus 100. Furthermore, the distance (z) between the substrate 104 and the plasma source chamber 106 may be decreased to further increase Psub.

In various other embodiments, Psub may be increased relative to Psource by modifying a pumping speed of the deposition chamber pump 122 and/or a plasma source chamber pump 138. For example, if the pumping speed of the deposition chamber pump 122 is decreased, Psub will be increased due to the overall increase of the deposition chamber 108 pressure. Also, by increasing the pumping speed of the plasma source chamber pump 138, while decreasing the pumping speed of the deposition chamber pump 122, the pressure in the deposition chamber 108 will be higher than the plasma source chamber 106. In some embodiments, the pressure adjustment can also be done by using a throttle valve (not shown) to change the pumping conductance.

In some embodiments, one or more of the components of the processing apparatus 100 may be automatically or semi-automatically operated by a controller 140 coupled to or otherwise in communication therewith. The controller 140 may be or include a general-purpose computer or network of general-purpose computers programmed to perform desired input/output functions. For example, in one embodiment, the controller may be programmed to generate an ion beam for delivery to the substrate, deliver the POU gas to the substrate together with the ion beam, and modify a pressure within the deposition chamber in the area proximate the substrate to increase an amount of reactive ions impacting the substrate when the POU gas and the ion beam are delivered to the substrate. In some embodiments, the controller 140 operates with one or more sensors (not shown) for receiving an indication of the pressure gradient between Psub and Psource, and modifying one or more of the above described parameters to increase Psub, such as the gas flow rate of gas inlets 1-4, the pumping speed of the deposition chamber pump 122 and/or the plasma source chamber pump 138, and/or the distance 'z' between the substrate 104 and an exit of the plasma source chamber 106.

The controller 140 may also include communication devices, data storage devices, and software. The user interface system may include devices such as touch screens, keyboards, user pointing devices, displays, printers, etc. to allow a user to input commands and/or data and/or to monitor the plasma doping apparatus via the controller 140. The embodiments of the disclosure are not limited in this context.

In an exemplary embodiment, the processing apparatus 100 delivers an inert plasma gas 142, such as Ar or He, to the plasma source chamber 106 via the first gas inlet 107 for production of a plasma 144 therein. Meanwhile, the second gas inlet 110 and the third gas inlet 112 respectively deliver the first and second POU gases 116 and 118, such as $SiH_4$ and $NH_3$, to the area 130 adjacent the substrate 104. In this embodiment, the first and second POU gases 116 and 118 bypass the plasma source chamber 106 and are injected directly into the deposition chamber 108. As configured, an increase in Psub proximate the substrate 104 causes the exposure of the neutral atoms/molecules 136 to the substrate to decrease, resulting in a film layer 150 growth reliant mainly on gas reaction with energy carried by the reactive ions 132. This benefits angled ion implantation because the process becomes an ion-activated deposition rather than neutral-dominated deposition having no directionality.

In other embodiments, delivery of the gases may be swapped, meaning the inert plasma gas may be delivered via the second and/or third gas inlets 110 and 112, and the reactive gases may be delivered via the first gas inlet 107. In such case, with higher pressure Psub proximate the substrate 104, growth of the film layer 150 by neutral surface reaction will be limited, and will primarily rely on the reactive ions 132 (e.g., $SiH_3+$, $SiH+$, $NH_2+$, etc.) to implant or deposit on the substrate 104. Again, this benefits angled ion implantation because the process becomes an ion-activated deposition rather than neutral-dominated deposition with no directionality.

Figure 3:
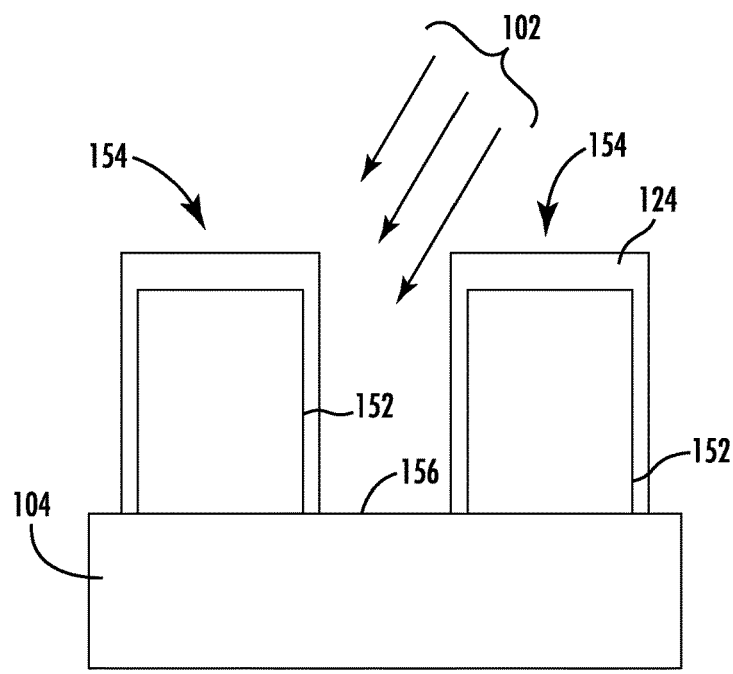
FIG. 3 is a side cross-sectional view of an approach for forming a film layer over a set of features of a substrate according to embodiments of the present disclosure.

As shown, in one embodiment, the first and second POU gases 116 and 118 are delivered to the substrate 104 together with the ion beam 102. In another embodiment, the exposure of the reaction POU gases 116, 118 and the ion beam 102 may be done separately. In either implementation, the ion beam 102 is directed to the substrate 104 at an angle to form the film layer 150 thereon, for example, as shown in FIGS. 3-4.

Figure 4:
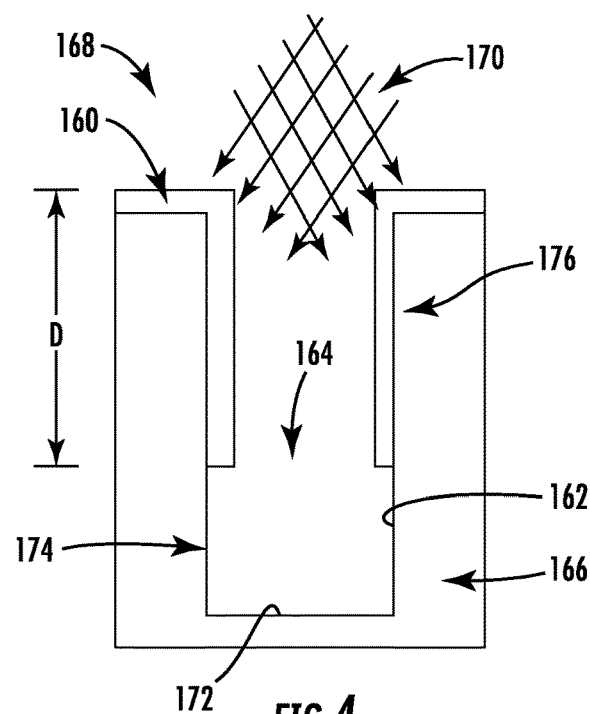
FIG. 4 is a side cross-sectional view of an approach for forming a trench material over a set of features of a substrate according to embodiments of the present disclosure.

In exemplary embodiments, as shown in FIG. 4, ions of the ion beam 102 are implanted to a sidewall surface 152 of one or more of a set of features 154 (e.g., photoresist patterning features, substrate fins, etc.) of the substrate 104 to form the film layer 150 thereon. In exemplary embodiments, the ion beam 102 is directed towards the substrate 104 at an angle nonparallel with the sidewall surface 152, although, in other embodiments, the ion beam 102 may be implanted at an angle substantially perpendicular to a surface 156 of the substrate 104. As shown, the ion beam 102 implants ions at approximately 30° incidence angle to the sidewall surface 152 (or approximately 60° relative to a plane normal to the sidewall surface 152) to prevent the formation of nano-scale hardmasks in organic and inorganic materials. The implantation angle may vary in other embodiments by +/−15°. Furthermore, in some embodiments, implantation of the ion beam 102 works in combination with a subsequent plasma etch process (not shown) to improve line edge roughness.

In exemplary embodiments, the film layer 150 is an organic or inorganic material deposited on the set of features 154, wherein deposition may occur in the deposition chamber 108 (FIG. 1), and may be optimized to deposit primarily on the sidewall surface 152 and/or the top of the set of features 154. The specific chemistry and process parameters can be chosen so the deposition occurs either uniformly within a plasma, for example, at an angle and in a direction of the arrows depicting the ion beam 102.

In another embodiment, with reference to FIGS. 1 and 4, the processing apparatus 100 may be used to selectively form a layer of trench material 160 (e.g., SiN) along just a portion of a sidewall surface 162 of a trench 164 formed in the substrate 166 of the device 168. For example, the trench 164 may be exposed to a precursor delivered to the substrate 166 via one or more of the gas inlets of the deposition chamber 108. The precursor may be conformally disposed along the sidewall surfaces 162 of the trench 164. In one embodiment, the precursor may be a reactive precursor (e.g., $SiBr_4$) chemisorbed to the surfaces of the trench 164 to form terminal $SiBr_3$ groups.

The precursor may be a precursor application introduced into the deposition chamber 108 in vapor form, for example, produced by vaporizing a liquid precursor solution through a conventional vaporization process such as direct vaporization, distillation, or by bubbling an inert gas (e.g. $N_2$, He, Ar, etc.) into the precursor solution and providing the inert gas plus precursor mixture as a precursor vapor solution to deposition chamber 108. Bubbling with an inert gas can also remove any dissolved oxygen present in the precursor solution.

A capping layer may subsequently be formed along the set of sidewall surfaces 162 of the trench 164, e.g., by reacting the precursor with a capping compound. The capping compound may be a reactant reaction gas, such as POU gases 116, 118 of FIG. 1, introduced into the deposition chamber 108 for use in converting the chemisorbed precursor to the desired material on the deposition surface. Typically, the reactant is capable of reaction with the already chemisorbed precursor. In one non-limiting embodiment, the capping compound is ethylenediamine, and the NH groups react with bromine of the precursor to evolve HBr and form Si—$NHCH_2CH_2NH$—Si linkages. Thus, capping the surface with the capping layer prevents further thermal ALD growth. Furthermore, the capping layer is configured to be relatively unreactive to thermal ALD and/or low energy radical-based ALD, and reactive to high energy ions for breaking up a capping molecule of the capping compound.

As further shown in FIG. 4, an ion implantation 170 is performed to form the trench material 160. The ion implantation 170 causes ions to be implanted into the device 168 at an angle non-perpendicular with a bottom surface 172 of the trench 164 and non-parallel with the sidewall surfaces 162 as well. For example, the ions may be implanted into the sidewall surfaces 162 at an angle of 60° relative to a plane normal to the sidewall surfaces 162. The implantation angle may vary in other embodiments by +/−15° relative to the plane normal to the sidewall surfaces 162. In some embodiments, the ions may be implanted into sidewall surfaces 162 of the trench 164 at an angle selected to prevent ions from implanting the bottom surface 172 of the trench 164 and a lower portion 174 of the sidewall surface 162.

In one embodiment, the ion implantation 170 is a highly directional Ar ion treatment performed to reactivate just an upper section 176 of the capping layer by breaking up the C—C bonds creating reactive sites. As a result, $SiBr_4$ exposed to the surface will react with the activated surfaces (tops and bottoms) to terminate the tops and bottoms with Si—Br groups. This enables the layer of trench material 160 to be formed (e.g., grown) along the activated portions of the capping layer to a depth 'D', resulting in the structure shown in FIG. 4.

Figure 5:
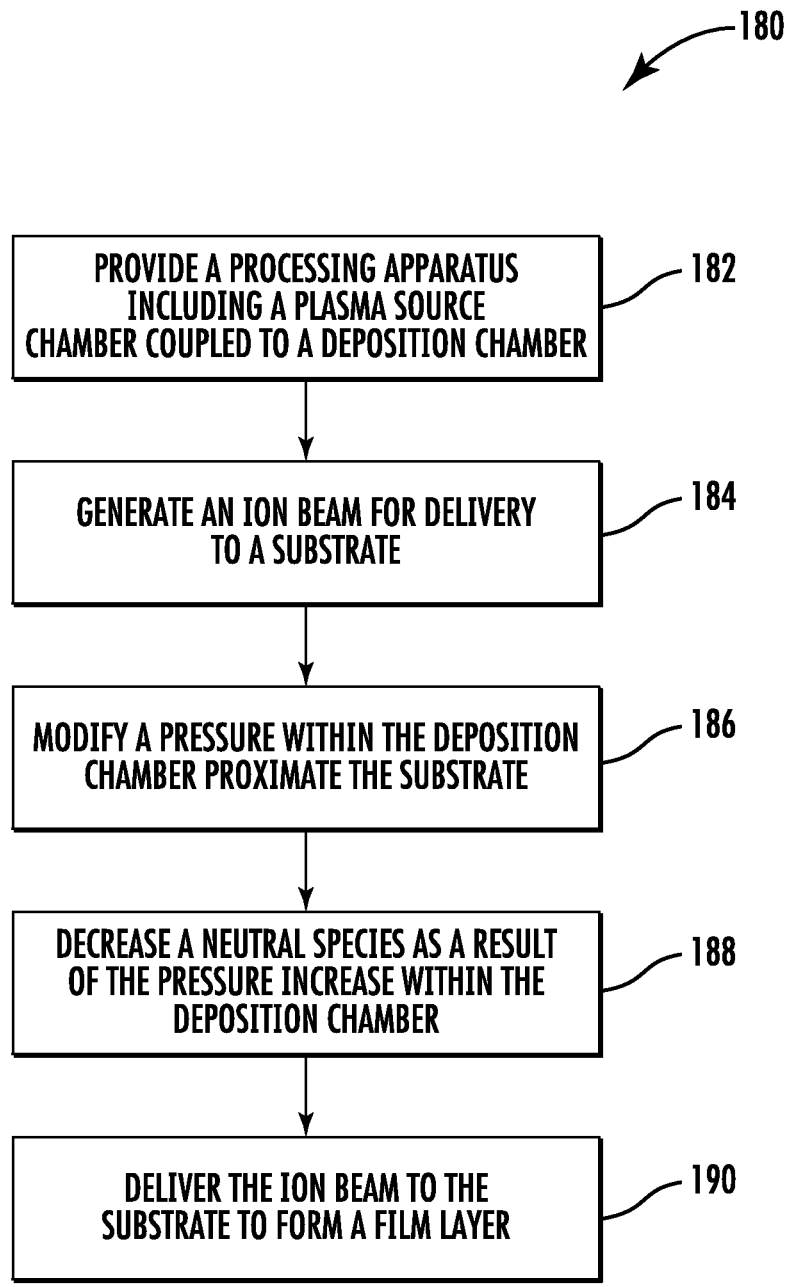
FIG. 5 is a flowchart illustrating an exemplary method according to embodiments of the present disclosure.

Referring now to FIG. 5, a flow diagram illustrating an exemplary method 180 for patterning a semiconductor device in accordance with the present disclosure is shown. The method 180 will be described in conjunction with the representations shown in FIGS. 1-4.

The method 180 may include providing a processing apparatus including a plasma source chamber coupled to a deposition chamber, as shown in block 182. In some embodiments, the plasma source chamber includes a first gas inlet, and the deposition chamber includes a second and third gas inlets. In some embodiments, the second and/or third gas inlets deliver a point of use (POU) gas to an area proximate a substrate disposed within the deposition chamber.

The method 180 may further include generating an ion beam for delivery to the substrate, as shown at block 184. In some embodiments, the ion beam is extracted from a plasma generated within the plasma source chamber.

The method 180 may further include modifying a pressure within the deposition chamber in the area proximate the substrate, as shown at block 186. In some embodiments, the pressure is modified by increasing an amount of reactive ions impacting the substrate with the POU gas and the ion beam are delivered to the substrate. In some embodiments, a pressure gradient between the deposition chamber and the plasma source chamber is increased to increase the pressure. In some embodiments, the pressure within the deposition chamber in the area proximate the substrate is increased by adjusting at least one of the following: a gas flow rate of the first inlet, a gas flow rate of the second inlet, a gas flow rate of the third gas inlet, and a distance between the substrate and the plasma source chamber. In some embodiments, the pressure within the deposition chamber in the area proximate the substrate is increased by decreasing a distance between the substrate and the plasma source chamber. In some embodiments, the pressure within the deposition chamber in the area proximate the substrate is increased by adjusting a pump speed of a deposition chamber pump and/or a pump speed of a plasma chamber pump. In some embodiments, a controller may independently control the gas flow rate of the first gas inlet, the gas flow rate of the second gas inlet, and the gas flow rate of the third gas inlet, the pump speed of the deposition chamber pump, and the pump speed of the plasma source chamber pump.

The method 180 may further include decreasing a neutral species as a result of the pressure increase within the deposition chamber in the area proximate the substrate, as shown at block 188. In some embodiments, the ratio of reactive ions to the neutral species is increased as a result of the pressure increase.

The method 180 may further include delivering the POU gas to the substrate together with the ion beam to form a film layer, as shown at block 190. In some embodiments, delivering the ion beam to the substrate includes performing an angled ion implant. In some embodiments, the ions are implanted into the substrate an angle substantially non-parallel to a sidewall of a trench, and non-parallel to a bottom surface of the trench.

Although the illustrative method 180 is described above as a series of acts or events, the present disclosure is not limited by the illustrated ordering of such acts or events unless specifically stated. Some acts may occur in different orders and/or concurrently with other acts or events apart from those illustrated and/or described herein, in accordance with the disclosure. In addition, not all illustrated acts or events may be required to implement a methodology in accordance with the present disclosure. Furthermore, the method 180 may be implemented in association with the formation and/or processing of structures illustrated and described herein as well as in association with other structures not illustrated.

In view of the foregoing, at least the following advantages are achieved by the embodiments disclosed herein. A first advantage of the disclosure is ability to provide active control of surface chemistry reactions by tuning the ion/neutral ratios, thus making an ion implant process more "ion-driven". A second advantage of the disclosure includes an ability to selectively grow a thin film with enhanced profile control, for directional deposition.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

The invention claimed is:

1. A method comprising:
   providing a processing apparatus comprising:
      a plasma source chamber including a first gas inlet delivering a first gas; and
      a deposition chamber coupled to the plasma source chamber, the deposition chamber including a second gas inlet and a third gas inlet delivering a point of use (POU) gas to an area proximate a substrate disposed within the deposition chamber, wherein the POU gas is different than the first gas, wherein the POU gas is delivered from the second gas inlet and from the third inlet on opposite sides of the first gas, and wherein the POU gas is delivered from the second gas inlet and from the third gas inlet in a same direction orthogonal to the substrate;
   generating an ion beam for delivery to the substrate; and
   modifying a pressure within the deposition chamber in the area proximate the substrate to increase an amount of reactive ions present for impacting the substrate when the ion beam is delivered to the substrate, wherein pressure is modifiable by each of: a deposition chamber pump fluidly connected with the deposition chamber, and a plasma source chamber pump fluidly connected with the plasma source chamber.

2. The method according to claim 1, further comprising increasing a pressure gradient between the deposition chamber and the plasma source chamber.

3. The method according to claim 1, further comprising increasing the pressure within the deposition chamber in the area proximate the substrate by adjusting at least one of the following: a gas flow rate of the first inlet, a gas flow rate of the second inlet, a gas flow rate of the third gas inlet, and a distance between the substrate and the plasma source chamber.

4. The method according to claim 3, further comprising increasing the pressure within the deposition chamber in the area proximate the substrate by decreasing the distance between the substrate and the plasma source chamber.

5. The method according to claim 3, further comprising independently controlling, using a controller, the gas flow rate of the first gas inlet, the gas flow rate of the second gas inlet, and the gas flow rate of the third gas inlet.

6. The method according to claim 3, further comprising delivering a reaction gas to the deposition chamber via the second gas inlet and the third gas inlet.

7. The method according to claim 1, further comprising increasing the pressure within the deposition chamber in the area proximate the substrate by adjusting a pump speed of the deposition chamber pump or a pump speed of the plasma source chamber pump.

8. The method according to claim 1, further comprising introducing an inert gas to the substrate via the first gas inlet.

9. The method according to claim 1, further comprising decreasing a neutral species of the ion beam by increasing the pressure within the deposition chamber in the area proximate the substrate.

10. The method according to claim 9, further comprising increasing a ratio of the amount of reactive ions to the neutral species.

11. The method according to claim 1, further comprising forming a film layer on the substrate using the ion beam.

12. A method for increasing a ratio of reactive ions to a neutral species, the method comprising:
   providing a processing apparatus comprising:
      a plasma source chamber including a first gas inlet delivering a first gas; and
      a deposition chamber coupled to the plasma source chamber, the deposition chamber including a second gas inlet and a third gas inlet delivering a point of use (POU) gas to an area proximate a substrate disposed within the deposition chamber, wherein the POU gas is different than the first gas, wherein the POU gas is delivered from the second gas inlet and from the third inlet on opposite sides of the first gas, and wherein the POU gas is delivered from the second gas inlet and from the third gas inlet in a same direction orthogonal to the substrate;
   increasing a pressure within the deposition chamber in an area proximate the substrate to increase an amount of reactive ions present for impacting the substrate when an ion beam is delivered to the substrate, wherein the pressure is increasable by each of the following: a pump speed of a deposition chamber pump fluidly connected with the deposition chamber, a pump speed of a plasma source chamber pump fluidly connected with the plasma source chamber, and a distance between the substrate and the plasma source chamber; and
   generating the ion beam for delivery to the substrate.

13. The method according to claim 12, further comprising reducing an amount of neutral species present when the ion beam is delivered to the substrate by increasing a pressure gradient between the deposition chamber and the plasma source chamber.

14. The method according to claim 12, further comprising increasing the pressure within the deposition chamber in the area proximate the substrate by decreasing the distance between the substrate and the plasma source chamber.

15. The method according to claim 12, further comprising increasing the pressure within the deposition chamber in the area proximate the substrate by adjusting a gas flow rate of a first gas inlet of the plasma source chamber or a gas flow rate of at least one gas inlet of the deposition chamber.

16. The method according to claim 15, further comprising delivering a reaction gas to the deposition chamber via the at least one gas inlet of the deposition chamber.

17. The method according to claim 15, further comprising introducing an inert gas to the substrate via the first gas inlet.

18. The method according to claim 15, further comprising independently controlling, using a controller, at least one of: the gas flow rate of the first gas inlet, the gas flow rate of the at least one gas inlet of the deposition chamber, the pump speed of the deposition chamber pump, and the pump speed of the plasma source chamber pump.

19. The method according to claim 12, further comprising forming a film layer on the substrate.

20. A method for increasing a ratio of reactive ions to a neutral species, the method comprising:
   providing a processing apparatus comprising:
      a plasma source chamber including a first gas inlet delivering a first gas; and
      a deposition chamber coupled to the plasma source chamber, the deposition chamber including a second gas inlet and a third gas inlet delivering a point of use (POU) gas to an area proximate a substrate disposed within the deposition chamber, wherein the POU gas is different than the first gas, wherein the POU gas is delivered from the second gas inlet and from the third inlet on opposite sides of the first gas, and wherein the POU gas is delivered from the second gas inlet and from the third gas inlet in a same direction orthogonal to the substrate;

increasing a pressure within the deposition chamber in an area proximate the substrate to increase an amount of reactive ions present for impacting the substrate when an ion beam is delivered to the substrate, wherein the pressure is increased by optimizing each of the following: a gas flow rate of a first inlet of the plasma source chamber, a gas flow rate of at least one gas inlet of the first and second inlets of the deposition chamber, a distance between the substrate and the plasma source chamber, a pump speed of a deposition chamber pump fluidly connected with the deposition chamber, and a pump speed of a plasma source chamber pump fluidly connected with the plasma source chamber; and generating the ion beam for delivery to the substrate, wherein the increase in pressure in the area proximate the substrate increases a ratio of reactive ions to neutral species impacting the substrate when the ion beam is delivered to the substrate, and wherein the ion beam is delivered to the substrate at a non-perpendicular angle relative to the substrate.

* * * * *